United States Patent
Chung

(10) Patent No.: US 8,349,677 B2
(45) Date of Patent: Jan. 8, 2013

(54) SEMICONDUCTOR DEVICE AND METHOD FOR MANUFACTURING THE SAME

(75) Inventor: Woo Young Chung, Yongin (KR)

(73) Assignee: Hynix Semiconductor Inc., Icheon-Si (KR)

( * ) Notice: Subject to any disclaimer, the term of this patent is extended or adjusted under 35 U.S.C. 154(b) by 266 days.

(21) Appl. No.: 12/648,218

(22) Filed: Dec. 28, 2009

(65) Prior Publication Data

US 2010/0320511 A1 Dec. 23, 2010

(30) Foreign Application Priority Data

Jun. 17, 2009 (KR) .................. 10-2009-0054014

(51) Int. Cl.
*H01L 21/336* (2006.01)
*H01L 21/8234* (2006.01)

(52) U.S. Cl. . 438/197; 438/285; 257/288; 257/E29.128; 257/E21.409

(58) Field of Classification Search .................. 257/224, 257/243
See application file for complete search history.

(56) References Cited

U.S. PATENT DOCUMENTS

| 2002/0125497 | A1 | 9/2002 | Fitzgerald | |
|---|---|---|---|---|
| 2002/0192915 | A1* | 12/2002 | Wada et al. | 438/305 |
| 2005/0184316 | A1* | 8/2005 | Kim et al. | 257/213 |
| 2007/0126035 | A1* | 6/2007 | Ernst et al. | 257/288 |

FOREIGN PATENT DOCUMENTS

| JP | 2003-249648 A | 9/2003 |
|---|---|---|
| KR | 1020010102557 A | 11/2001 |
| KR | 1020060118407 A | 11/2006 |

* cited by examiner

*Primary Examiner* — Michelle Mandala
*Assistant Examiner* — Shaka White

(57) ABSTRACT

A semiconductor device is fabricated by forming a semiconductor substrate as a convex shape to increase a effective channel of a transistor and by stacking a first silicon germanium layer and a first silicon layer on the semiconductor substrate to form a first layer and stacking a second silicon germanium layer and a second silicon layer on the first layer to form a second layer such that the current reduced due to the increased effective channel is ensured, thereby being capable of high speed performance.

17 Claims, 5 Drawing Sheets

SEMICONDUCTOR DEVICE AND METHOD FOR MANUFACTURING THE SAME

CROSS-REFERENCES TO RELATED APPLICATION

Priority to Korean patent application number 10-2009-0054014, filed on Jun. 17, 2009, which is incorporated by reference in its entirety, is claimed.

BACKGROUND OF THE INVENTION

The embodiments described herein relate to a semiconductor device and, more particularly, to a semiconductor device having a convex type gate pattern and a method for manufacturing the same.

Recently, due to increased integration of a semiconductor device, the size of the gate is gradually scaled down and the length of the channel length between source and drain regions is shortened. Due to this, the switching performance is lowered and the power consumption is increased. Furthermore, it may create a punch-through phenomenon which causes device characteristics to deteriorate.

Among the issue points, the short channel effect due to reduction of the gate channel length is most serious.

As the semiconductor device becomes highly integrated, a nano device with higher speed and lower operation voltage (e.g., 1V through 2V) is required which then requires a lower threshold voltage. However, if the threshold voltage is lowered to far, it is impossible to control the device due to the short channel effect. Furthermore, the short channel effect causes a drain induced built in leakage (DIBL) due to hot carriers.

Research regarding the short channel effect have grown. However, the short channel effect still remains due to the continuing integration of devices.

In the prior semiconductor device and fabrication method thereof, it is difficult to achieve very high speed performance due to the short channel effect in the transistor. Changes to the effective channel length and ion implantation process have been made to improve the short channel effect, but the above problems still remain.

BRIEF SUMMARY OF THE INVENTION

According to one aspect of an example embodiment, a semiconductor device includes a first layer arranged on a semiconductor substrate, the first layer including a first silicon germanium layer and a first silicon layer stacked, a second layer arranged on the first layer, the second layer including a second silicon germanium layer and a second silicon layer stacked, a body configured to be formed by etching the second layer, and a gate pattern surrounding the body.

The first silicon germanium layer has a thickness of 300 Å through 500 Å.

The first silicon layer has a thickness of 500 Å through 1000 Å.

The gate pattern including a gate dielectric layer formed over the body and a gate conductive material formed over the gate dielectric layer.

The silicon germanium structure and the silicon structure are obtained by etching a second silicon germanium layer and a second silicon layer, and wherein the second silicon germanium layer has a thickness of 100 Å through 200 Å.

The semiconductor device of claim 1, wherein the silicon germanium structure and the silicon structure are obtained by etching a second silicon germanium layer and a second silicon layer, and wherein the second silicon layer has a thickness of 200 Å through 6000 Å.

The body is an inner part of the gate pattern and has a convex shape.

The body has protruding portions and indented portions. the gate pattern defines first and second channels, the first silicon germanium layer and the first silicon layer defining the first channel and the body defining the second channel.

According to another aspect of another example embodiment, a method for manufacturing a semiconductor device includes forming a first layer over a substrate, the first layer including a first silicon germanium layer and a first silicon layer, forming a second layer over the first layer, the second layer including a second silicon germanium layer and a second silicon layer, etching the second layer to form a body and forming a gate pattern over the first layer and the body.

The first silicon germanium layer is formed to a thickness of 300 Å through 500 Å.

The first silicon layer is formed to a thickness of 500 Å through 1000 Å.

The second silicon germanium layer is formed to a thickness of 100 Å through 200 Å.

The second silicon layer is formed to a thickness of 200 Å through 6000 Å.

The gate pattern includes the body, a conductive material and a dielectric material provided between the body and the conductive material.

Performing an ion implantation process after forming the body.

The gate pattern defines first and second channels, the first silicon germanium layer and the first silicon layer defining the first channel, and the body defining the second channel.

The conductive material and the gate dielectric layer enclose the body and wherein the body has a convex shape.

The forming a gate pattern includes forming a gate insulating layer, a gate polysilicon layer, a gate conductive layer and a gate hard mask layer over the body, and etching the gate hard mask layer, the gate conduction layer, the gate polysilicon layer and the gate insulating layer.

The gate conductive layer comprises a barrier metal and a metal layer.

These and other features, aspects, and embodiments are described below in the section entitled "DESCRIPTION OF SPECIFIC EMBODIMENTS".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Figure 1A:
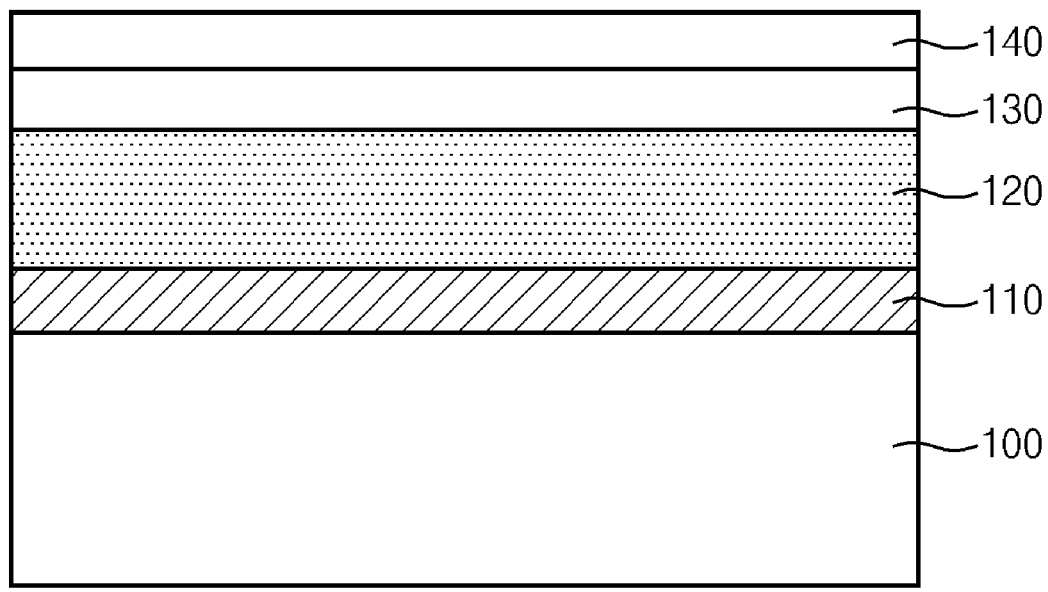
FIGS. 1a through 1e are sectional views illustrating a semiconductor device and a method for manufacturing the same according to an example embodiment.

Hereinafter, embodiments of the present invention will now be described more fully with reference to the accompanying drawings. The embodiments may, however, be embodied in many different forms and should not be construed as being limited to the instances set forth herein. Rather, the example embodiments herein are merely provided to help convey various concepts to those of ordinary skill in the art. In the drawings, the size of each element may have been exaggerated for clarity. Like reference numerals denote like elements throughout.

FIGS. 1a through 1e are sectional views illustrating a semiconductor device and a method for manufacturing the same according to an example embodiment.

Referring to FIG. 1a, a first silicon germanium layer 110 and a first silicon layer 120 are sequentially stacked on a semiconductor substrate 100 to form a first layer. A second silicon germanium layer 130 and a second silicon layer 140 are sequentially stacked on the first silicon layer 120 to form a second layer. At this time, the first silicon germanium layer 110 may be formed at a thickness of 300 Å through 500 Å and the first silicon layer 120 may be formed at a thickness of 500 Å through 1000 Å. The second silicon germanium layer 130 may be formed at a thickness of 100 Å through 200 Å and the second silicon layer 140 may be formed at a thickness of 200 Å through 6000 Å.

Herein, the first and second silicon germanium layers 110 and 130 apply the stress to the first and second silicon layer 120 and 140 to allow electrons to actively move. The first silicon germanium layer 110 and the first silicon layer 120 are used as a first channel and the second silicon germanium layer 130 and the second silicon layer 140 are used as a second channel. The dual channel consisting of the first and second layers ensures an increased current due to an increased effective channel, thereby making the semiconductor device perform with higher speed.

Figure 1B:
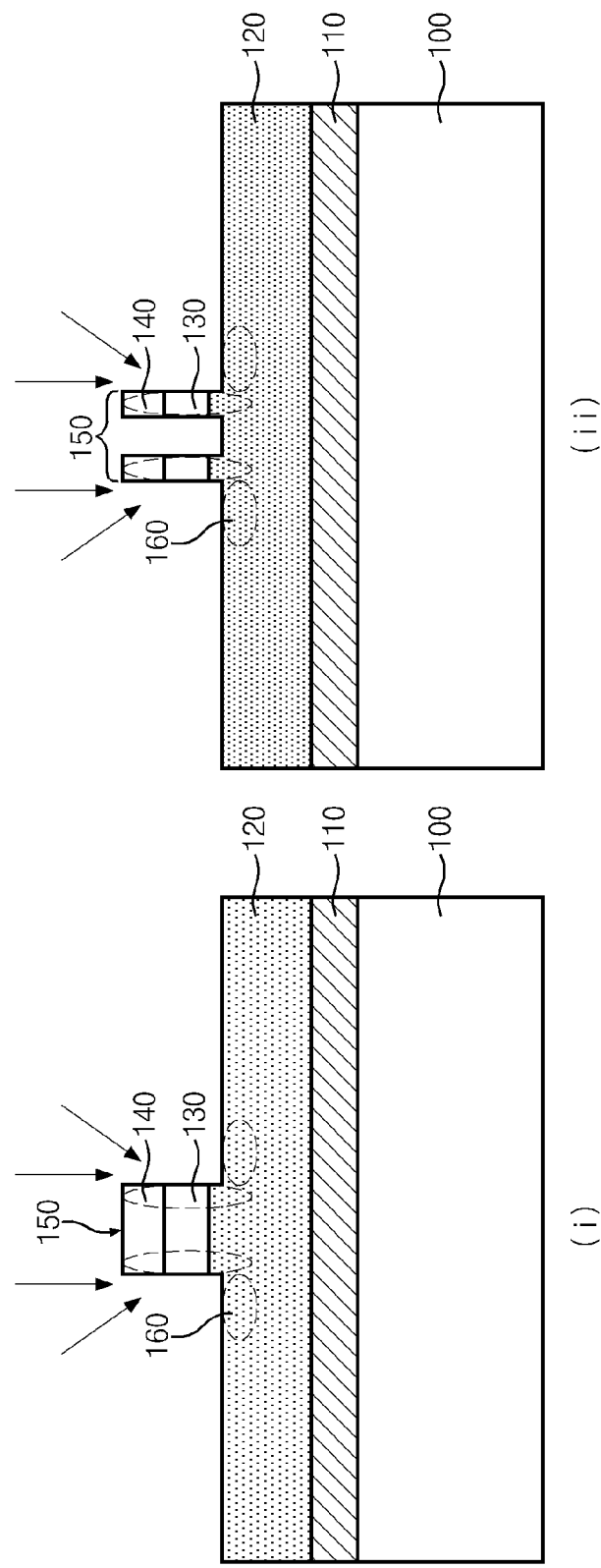

Referring to FIG. 1b (i) and (ii), a photosensitive layer (not shown) is formed on the second silicon layer 140 and is subjected to an exposure and development process using a mask for a body (not shown) to form a photosensitive pattern (not shown). The second silicon layer 140, the second silicon germanium layer 130 and the first silicon layer 120 are etched using the photosensitive pattern as an etch mask to form a body 150 which includes a silicon germanium layer pattern and a silicon layer pattern. As the silicon layer pattern becomes thicker, the depletion region is largely formed in the silicon layer pattern such that the inversion goes at higher speed into the depletion region, thereby improving the swing characteristic of the device.

Herein, the body 150 may have a convex shape. To further increase an effective channel, the body 150 may have protruding portions and indented portions as (ii) of FIG. 1b. It may control an etch depth of the first silicon layer 120 such that the first silicon layer 120 is etched by a thickness of 100 Å through 200 Å.

Following the forming of the body 150, it is subjected to an ion implantation process to form Lightly Doped Drain (LDD) 160 in the body 150 and at a periphery of the body 150.

Figure 1C:
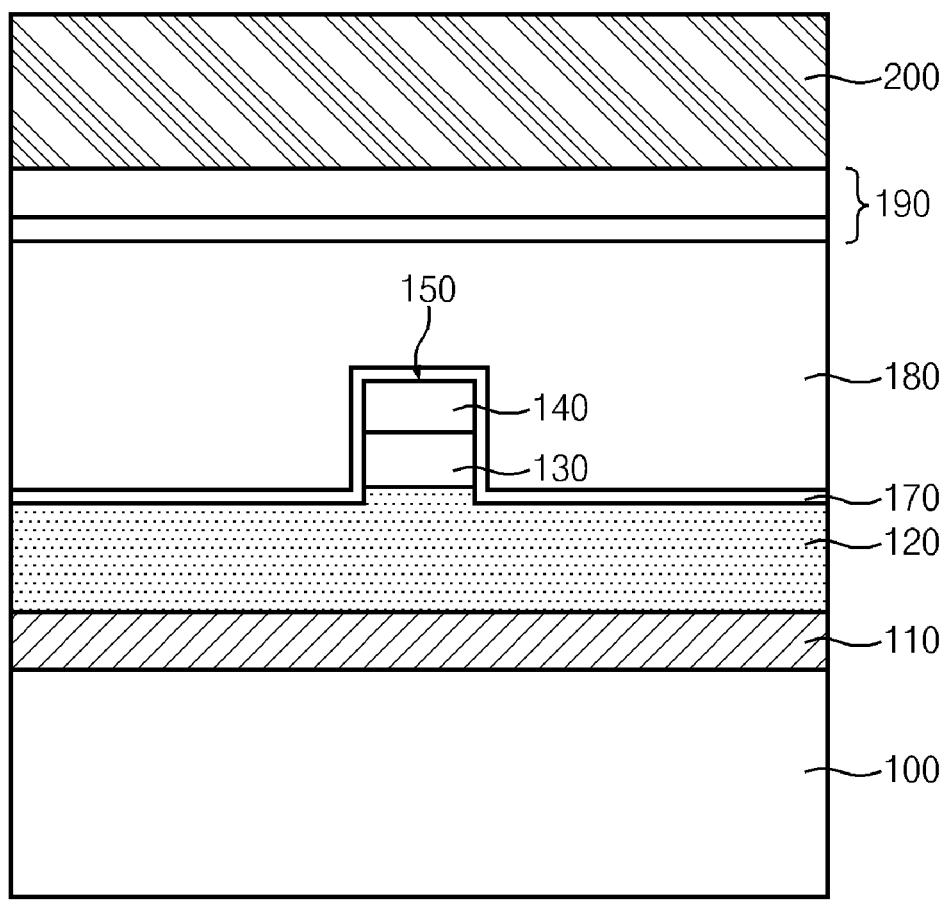

Referring to FIG. 1c, a gate oxide layer 170, a gate polysilicon layer 180, the gate conduction layer 190 and a gate hard mask layer 200 are sequentially deposited on the whole surface of the first silicon layer 120 including the body 150. Herein, the gate conduction layer 190 may include a barrier metal and a metal layer. The barrier metal may include a Ti/TiN layer and the metal layer may include W or Al.

Next, a photosensitive layer (not shown) is formed on the gate hard mask layer 200 and is subjected to an exposure and development process using a gate pattern mask (not shown) to form a photosensitive pattern (not shown).

Figure 1D:
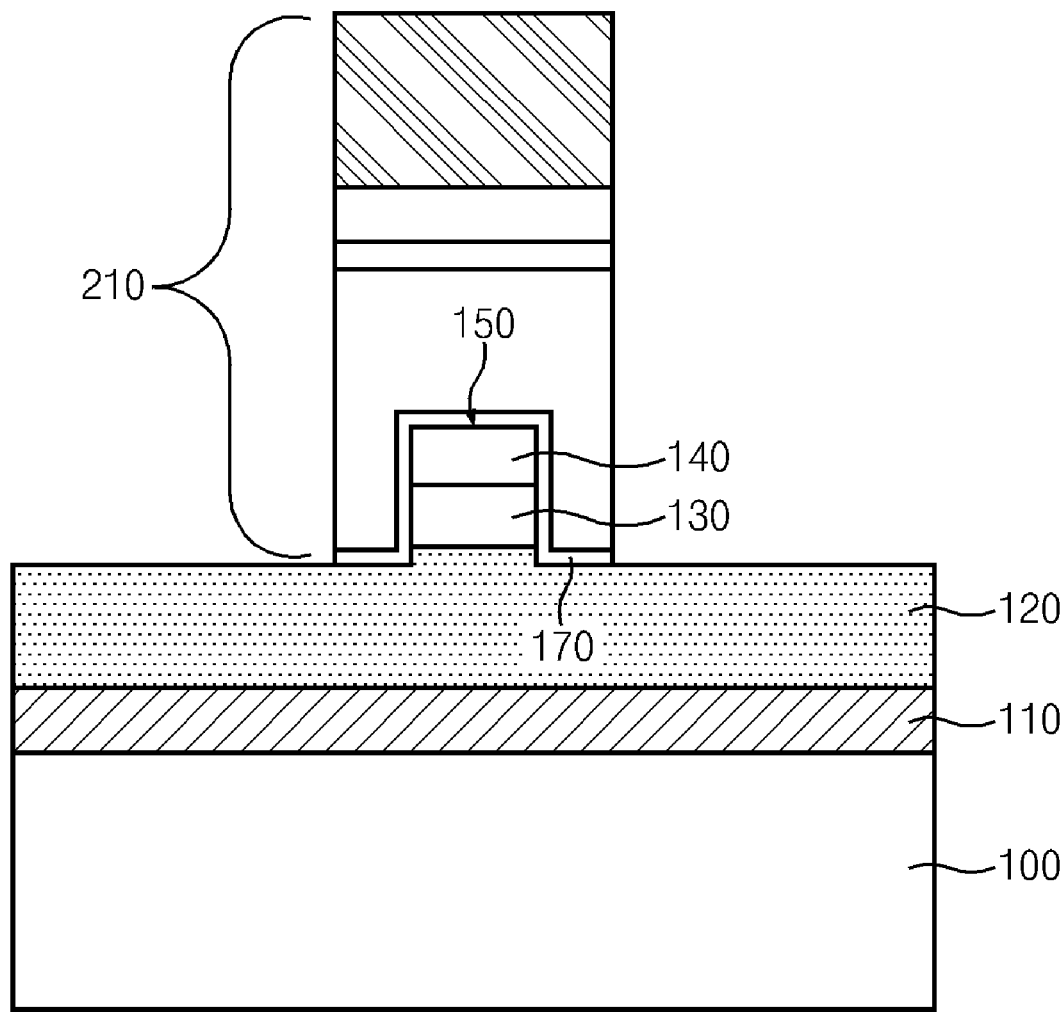

Referring to FIG. 1d, the gate hard mask layer 200, the gate conduction layer 190, the gate polysilicon layer 180 and the gate oxide layer 170 are etched using the photosensitive pattern as an etch mask to form a gate pattern 210 surrounding the body 150.

Figure 1E:
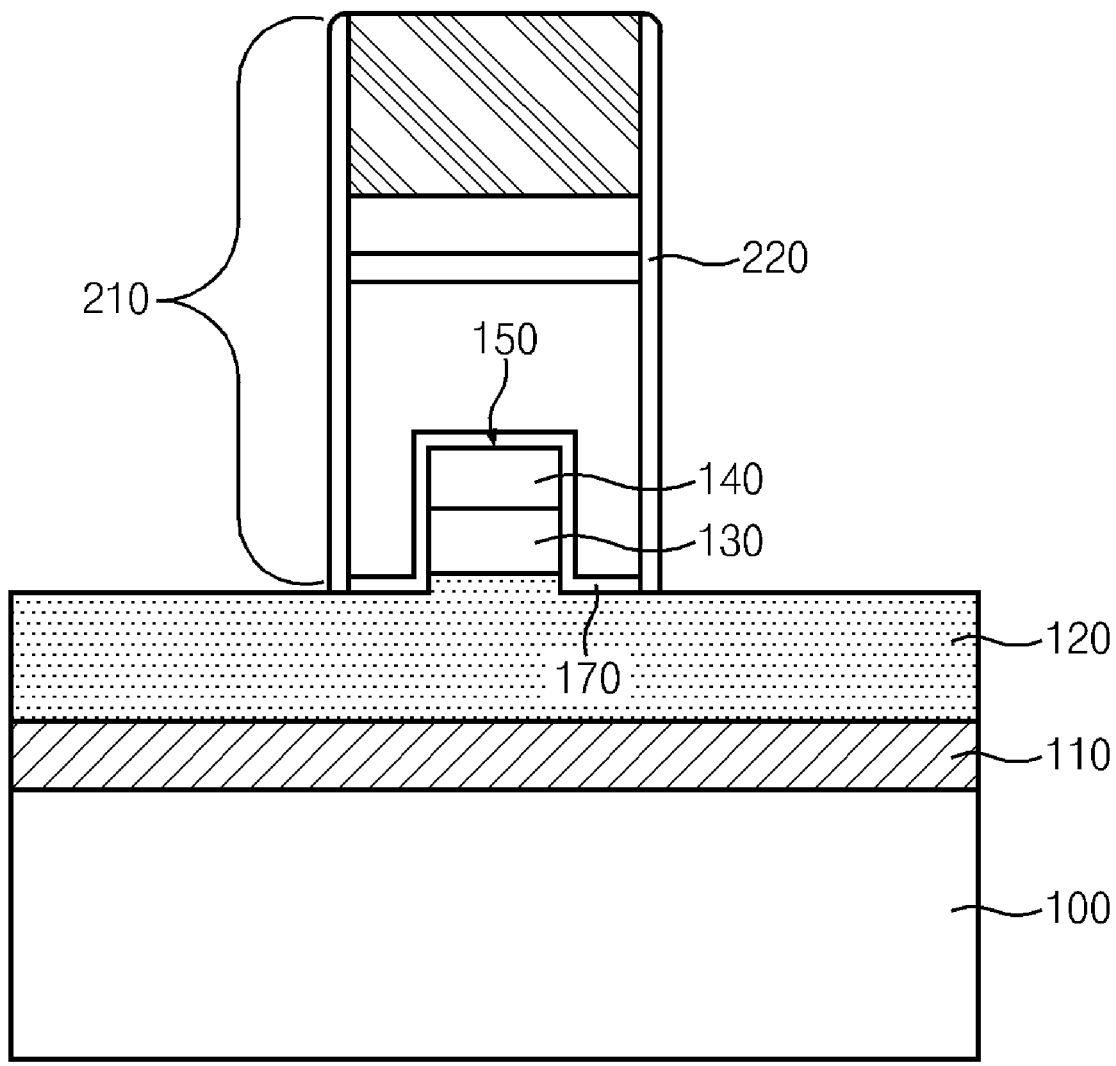

Referring to FIG. 1e, a gate spacer formation material (not shown) is deposited on the whole surface of the first silicon layer 120 including the gate pattern 210 and is then etched to form gate spacers 220 on the sidewalls of the gate pattern 210. An ion implantation process is carried out to form source and drain regions (not shown) in the first silicon layer 120.

As described above, a semiconductor substrate is formed as a convex shape to increase an effective channel of a transistor. A first silicon germanium layer and a first silicon layer are stacked on the semiconductor substrate to form a first layer and the second silicon germanium layer and a second silicon layer are stacked on the first layer to form the second layer to ensure increased current due to the increased effective channel, thereby enabling high speed performance.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device, comprising:
   a stacked layer provided over a substrate, the stacked layer including a first silicon germanium layer and a first silicon layer;
   a body defined over the stacked layer, the body including a silicon germanium structure and a silicon structure; and
   a gate pattern formed over the stacked layer and surrounding the body,
   wherein the body further includes first and second protruding portions protruding from a surface of the first silicon layer, and an indented portion comprising a space disposed between the first and second protruding portions.

2. The semiconductor device of claim 1, wherein the first silicon germanium layer has a thickness of 300 Å through 500 Å.

3. The semiconductor device of claim 1, wherein the first silicon layer has a thickness of 500 Å through 1000 Å.

4. The semiconductor device of claim 1, wherein the gate pattern including a gate dielectric layer formed over the body and a gate conductive material formed over the gate dielectric layer.

5. The semiconductor device of claim 1, wherein the silicon germanium structure and the silicon structure are obtained by etching a second silicon germanium layer and a second silicon layer, and
   wherein the second silicon germanium layer has a thickness of 100 Å through 200 Å.

6. The semiconductor device of claim 1, wherein the silicon germanium structure and the silicon structure are obtained by etching a second silicon germanium layer and a second silicon layer, and
   wherein the second silicon layer has a thickness of 200 Å through 6000 Å.

7. The semiconductor device of claim 1, wherein the body is an inner part of the gate pattern and has a convex shape.

8. The semiconductor device of claim 1, wherein the gate pattern defines first and second channels, the first silicon germanium layer and the first silicon layer defining the first channel and the body defining the second channel.

9. A method for manufacturing a semiconductor device, comprising:

forming a first layer over a substrate, the first layer including a first silicon germanium layer and a first silicon layer;

forming a second layer over the first layer, the second layer including a second silicon germanium layer and a second silicon layer;

etching the second layer to form a body with a first protruding portion and a second protruding portion by etching an indented portion disposed between the first and second protruding portions until the first silicon layer is exposed; and forming a gate pattern over the first layer and the body, wherein the forming a gate pattern includes:

forming a gate insulating layer, a gate polysilicon layer, a gate conductive layer and a gate hard mask layer over the body; and etching the gate hard mask layer, the gate conductive layer, the gate polysilicon layer and the gate insulating layer.

10. The method of claim 9, wherein the first silicon germanium layer is formed to a thickness of 300 Å through 500 Å.

11. The method of claim 9, wherein the first silicon layer is formed to a thickness of 500 Å through 1000 Å.

12. The method of claim 9, wherein the second silicon germanium layer is formed to a thickness of 100 Å through 200 Å.

13. The method of claim 9, wherein the second silicon layer is formed to a thickness of 200 Å through 6000 Å.

14. The method of claim 9, further comprising performing an ion implantation process after forming the body.

15. The method of claim 9, wherein the gate pattern defines first and second channels, the first silicon germanium layer and the first silicon layer defining the first channel and the body defining the second channel.

16. The method of claim 15, wherein the gate pattern encloses the body and wherein the body has a convex shape.

17. The method of claim 9, wherein the gate conductive layer comprises a barrier metal and a metal layer.

* * * * *